United States Patent
Tomita

[19]

[11] Patent Number: 6,103,405
[45] Date of Patent: Aug. 15, 2000

[54] PLANAR INDUCTANCE ELEMENT

[75] Inventor: Hiroshi Tomita, Tokyo, Japan

[73] Assignee: Kabushiki Kaisha Toshiba, Kawasaki, Japan

[21] Appl. No.: 09/017,662

[22] Filed: Feb. 3, 1998

[30] Foreign Application Priority Data

Feb. 4, 1997 [JP] Japan ..................................... 9-021663

[51] Int. Cl.$^7$ ....................................................... G11B 5/66
[52] U.S. Cl. .............. 428/692; 428/694 T; 428/694 TM; 428/900; 148/304; 148/306; 148/313; 148/315; 148/403; 420/121
[58] Field of Search ..................................... 148/304, 403, 148/306, 313, 315; 420/121; 428/694 T, 694 TM, 692, 900

[56] References Cited

U.S. PATENT DOCUMENTS 5,522,946  6/1996  Tomota .................................... 148/304
5,583,474  12/1996  Mizoguchi ................................ 336/83

Primary Examiner—Leszek Kiliman
Attorney, Agent, or Firm—Finnegan, Henderson, Farabow, Garrett & Dunner, L.L.P.

[57] ABSTRACT

A planar inductance element is provided which has good high-frequency magnetic properties and which can be manufactured at high yield. The element has at least one ferromagnetic film which, whose high-frequency properties change only a little when thermal, magnetic and mechanical stresses are applied to them during the manufacture of the element. The film has high process immunity. The film has been formed by applying a stress in a plane of a ferromagnetic film having uniaxial magnetic anisotropy or forming an antiferromagnetic film on such a ferromagnetic film, and by heat-treating the resultant structure in a magnetic field, thereby inducing inplane unidirectional magnetic anisotropy in a prescribed direction. The ferromagnetic film thus formed has its high-frequency permeability improved and its high-frequency loss reduced. In forming the ferromagnetic film, the inplane unidirectional magnetic anisotropy may be induced at an angle of about 30° or about 60° to the longer axis of the rectangular planar inductance element. If so, the high-frequency loss of the film decreases, and the effective high-frequency permeability changes almost nil in spite of an anisotropic stress applied to the film during the manufacture of the planar inductance element.

24 Claims, 4 Drawing Sheets

PLANAR INDUCTANCE ELEMENT

BACKGROUND OF THE INVENTION

The present invention relates to a planar inductance element such as a planar inductor or a planar transformer, either having a ferromagnetic film.

In recent years, many researches and developments have been conducted for miniaturization of various electronic apparatuses. However, miniaturization of the power supply is far less advanced than the miniaturization of the main electronic section. As a consequence, the volume ratio of the power supply to the main electronic section is ever increasing. The miniaturization of an electronic apparatus largely depends upon the realization of LSI of the various circuits incorporated in the apparatus. Magnetic components required in the power supply, such as inductors and transformers, have yet to be miniaturized or made in the form of LSIs. The magnetic components are mainly responsible for the increase in the volume ratio of the power supply to the main electronic section.

In order to reduce the volume ratio, it has been proposed that planar magnetic elements be used. A planar magnetic element is a combination of a planar coil and a ferromagnetic layer. Studies have been conducted to improve the performance of planar magnetic elements. Ferromagnetic film for use in planer magnetic elements need to meet two requirements. First, it must have low loss in a high-frequency region of 100 kHz or more. Second, it must accomplish high saturation magnetization.

The permeability the ferromagnetic film exhibits in the high-frequency region results mainly from rotation magnetization process. To accomplish an ideal rotation magnetization process, high-frequency magnetic excitation must be conducted on the ferromagnetic film, along the magnetic hard axis of the film which exhibits uniform inplane uniaxial magnetic anisotropy. Physical parameters of importance which the ferromagnetic film must have are permeability along the magnetic hard axis and coercive force.

The high-frequency permeability has complex relation with the other various physical parameters. The physical parameter which more correlates with the high-frequency permeability than any other parameter may be the magnetic anisotropy field. The high-frequency permeability is substantially proportional to the reciprocal of the magnetic anisotropy field. In a magnetic element such as a thin-film inductor, the optimum value for the permeability of the ferromagnetic film changes with design. To exhibit high permeability in a high-frequency region so as to be used in a thin-film inductor, the ferromagnetic film must have inplane uniaxial anisotropy and controllability of the magnetic anisotropy field.

The greater the saturation magnetization of the ferromagnetic film of a magnetic element such as a thin-film inductor, the greater the possibility for the available power range and saturation current to increase. High saturation magnetization property is therefore important to ferromagnetic film for use in magnetic elements such as thin-film inductors.

Needless to say, ferromagnetic film which has low loss in the high-frequency region and which achieves high saturation magnetization is promising material for use in thin-film magnetic heads. This is because the recording density, the coercive force of recording media, the magnetic energy product, and the operating frequency of the heads are increasing.

Ferromagnetic film must meet the requirements described above, so that it may be used in any other magnetic element. When ferromagnetic film is employed in the form of either a single layer or a stacked layer in a magnetic element such as a thin-film inductor, its property somewhat deviates from the intrinsic property. This is a problem concerning the use of ferromagnetic film.

In the thin-film process technology, layers and films are formed, in most cases, on a substrate wafer before a number of magnetic elements are formed on the substrate. Among these layers and films are a resin layer, insulator film, metal film, protection film, and a patterning mask layer. After the magnetic elements, each having at least one ferromagnetic film, have been formed, films and layers are formed one on another, over the magnetic elements, in most cases.

These layers and films are formed by performing a sequence of processes including physical vapor deposition (PVD), chemical vapor deposition (CVD), plating, spin coating, and baking (e.g., curing), and the like. In the PVD or CVD, the temperature of the unfinished product inevitably rises to some extent while the layers and films are being formed, even if the substrate temperature is not raised during the PVD or CVD.

The ferromagnetic film and the other films and layers must be subjected to patterning to form electrodes and to form slits and through holes in the films and to achieve device isolation, thereby to provide magnetic circuits. The patterning is performed by forming masks in various methods and then by dry- or wet-etching the layers and films by using the masks.

In most cases, the stress applied to the surface of the ferromagnetic film or to the interface between the ferromagnetic film and any other film changes during the patterning. The stress applied to one part of the ferromagnetic film differs from the stress applied to any other part, in both magnitude and direction. In other words, the stress is dispersed in magnitude and direction. Further, the internal stress in the ferromagnetic film may change when the stress is released as the heat treatment proceeds. Changes in the stress and stress dispersion greatly influence the magnetic properties of the ferromagnetic film. The changes appear the most notable problem, in view of the desired magnetic properties to impart to the ferromagnetic film, the control of these properties, the coercive force relating to the rotation magnetization process, and the necessity of maintaining soft magnetism for achieving low loss.

The magnetic anisotropy of a ferromagnetic film responses to a strain in the film which has resulted from the stress applied to the film. An anisotropic stress, if any, applied to the ferromagnetic film induces magnetic anisotropy. The energy of the magnetic anisotropy thus induced is proportional to the magnetostriction constant of the ferromagnetic film.

To cause the ferromagnetic film incorporated in a planar inductance element to exhibit the designed magnetic properties, two alternative methods can be used. The first method is to reduce the anisotropic stress applied on the film during the manufacture of the inductance element. The second method is positively to utilize the anisotropic stress applied during the through-process of the inductance element, thereby to control the magnetic anisotropy of the ferromagnetic film. The inventor hereof have studied both methods to find that high technology is required to perform the second method successfully. It appears extremely difficult to use the second method to control the magnetic properties of the ferromagnetic film.

Generally, the inductance of a planar inductance element is almost proportional to a change in the magnetic anisotropy field of the ferromagnetic film used in the inductance element. In other words, the inductance is substantially proportional to a change in the high-frequency permeability. This change resulting from the magnetic excitation which is undergoing along the magnetic hard axis of the film during the rotation magnetization process.

Hence, the properties of the planar inductance element, such as inductance L and Q factor corresponding to the loss of inductance, will change if an anisotropic stress is generated or the dispersion of this stress takes place while the inductance element is being manufactured, being molded, or being assembled into a miniaturized power supply. This causes the deviation of the inductor properties from the typical values of the lot or the scattering of the specific values of the lot. Consequently, the planar inductance element fails to fulfill specification, and its manufacturing cost will increase.

The above-mentioned problems inherent in the planar inductance element have been found by studying the process of manufacturing the element. In view of the properties of the ferromagnetic film, it is important for the film to have a small magnetostriction constant. If the magnetostriction constant is small, the stress on the film will not influence the permeability, etc. of the film.

Various ferromagnetic materials are known to achieve high saturation magnetization and exhibit sufficient inplane uniaxial magnetic anisotropy. They are therefore suitable as materials of ferromagnetic films for use in planer inductance elements. Quite a few of these materials have a large magnetostriction constant. To reduce the magnetostriction constant, such a material may be doped with a specific amount of Si or the like. If the material is doped with Si or the like, however, the spontaneous magnetization will decrease inevitably. Consequently, ferromagnetic materials which need to attain high saturation magnetization of 1.5 T or more, except those having specific compositions, can hardly acquire a magnetostriction constant of zero.

Some measures must therefore be taken in the planar inductance element in order to minimize the changes of effective permeability which result from the magnetoelastic energy effect. More precisely, the planar inductance element must have a ferromagnetic film which is so designed as to prevent, as much as possible, the inductance of the element from changing as the high-frequency permeability changes. The term "effective permeability" means the permeability which contributes to the inductance value, pertaining to the high-frequency magnetic excitation undergoing in the planar inductance element.

As described above, it has been demanded that a ferromagnetic film be provided which maintain high saturation magnetization, soft magnetism and excellent high-frequency permeability, whose effective high-frequency permeability changes only a little despite the magnetoelastic energy effect during the manufacture of the miniaturized magnetic element having the ferromagnetic film, and whose effective permeability is hardly influenced by the process of manufacturing the magnetic element. It has also been demanded that a miniaturized inductance element be provided which incorporates an inductance element having such a ferromagnetic film.

As indicated above, the conventional planar inductance element is disadvantageous in that during the manufacture of the element, the magnetic properties of the ferromagnetic film changes because the stress applied to one part of the film differs the stress applied to another part of the film, in both magnitude and direction.

In view of the foregoing, the present invention has been made. Its object is to provide a ferromagnetic film whose effective high-frequency permeability changes or deteriorates but a little, despite the difference between the stresses applied to the different part of the film, thereby to improve the productivity and yield, and also to provide a planar inductance element having the ferromagnetic film.

BRIEF SUMMARY OF THE INVENTION

A planar inductance element according to this invention comprises one or more ferromagnetic films which exhibit inplane unidirectional magnetic anisotropy. The ferromagnetic film or films have effective high-frequency permeability and soft magnetism. Their high-frequency permeability changes and deteriorates only a little in spite of a stress applied to them, during and after the manufacture of the planar inductance element. Hence, the ferromagnetic film or films are suitable for use in planar inductance elements.

According to a first aspect of the invention, there is provided a planar inductance element having a ferromagnetic layer. The ferromagnetic layer has at least inplane uniaxial magnetic anisotropy. The layer is either a single ferromagnetic film or a composite film comprising a ferromagnetic film and magnetic films. The layer has been thermally, magnetically or mechanically treated and come to acquire inplane unidirectional magnetic anisotropy with magnetic moment aligned in a plane in one direction.

Preferably, the ferromagnetic layer may have two-fold rotation symmetry or four-fold rotation symmetry with respect to a vertical axis, and the inplane unidirectional magnetic anisotropy of the ferromagnetic layer may have a direction parallel to an axis of the uniaxial magnetic anisotropy or inclined at 30°±10° to the axis of the uniaxial magnetic anisotropy.

More preferably, the ferromagnetic layer may be rectangular or square, and the inplane unidirectional magnetic anisotropy of the ferromagnetic layer may have a direction parallel to one side of the ferromagnetic layer or inclined at 30°±10° to the side thereof.

According to a second aspect of the invention, there is provided a planar inductance element having a ferromagnetic layer. The ferromagnetic film has at least inplane uniaxial magnetic anisotropy, and is either a single ferromagnetic film or a composite film comprising a ferromagnetic film and magnetic films. The ferromagnetic layer has inplane unidirectional magnetic anisotropy having a direction which is inclined at 30°±10° to a direction in which a tensile stress or a compressive stress is applied in a plane of the ferromagnetic layer.

In the planer inductance element according to the second aspect, a resin layer may used as a upper protection film of the single ferromagnetic film or the composite film, and the inplane unidirectional magnetic anisotropy may have been developed by an anisotropic tensile or compressive stress applied in the plane of the ferromagnetic film during a curing process of the resin layer.

According to a third aspect of the invention, there is provided a planar inductance element having a ferromagnetic layer which has at least inplane uniaxial magnetic anisotropy, which is a single ferromagnetic film or a composite film comprising a ferromagnetic film and magnetic films and which has inplane unidirectional magnetic anisotropy. One of the magnetic films is an antiferromagnetic film, which may be made of any antiferromagnetic material such as alloys including Fe—Mn, Ni—Mn, Pd—Mn, Ir—Mn, Rh—Mn, Ru—Mn, Co—Mn, and oxides of Fe, Co and Ni. Composition of Ir—Mn, for example, is $Ir_{20}Mn_{80}$.

In any one of the planar inductance elements of the invention, described above, the ferromagnetic layer may comprise a plurality of ferromagnetic layers having inplane unidirectional magnetic anisotropy. The inplane magnetic anisotropy direction of at least one of the plurality of ferromagnetic films may differ from the inplane magnetic anisotropy direction of any ther of the plurality of ferromagnetic films. Alternatively, the inplane magnetic anisotropy direction of at least one of the plurality of ferromagnetic films is parallel or at right angles to the inplane magnetic anisotropy direction of any other of the plurality of ferromagnetic films.

In any planar inductance element of the present invention, the ferromagnetic layer may preferably have a saturation magnetostriction constant of at least 0.1 ppm in absolute value.

In any planar inductance element of the present invention, the ferromagnetic layer may preferably include an amorphous film containing Fe, Co, B and a 4B-group element, or a film of composite phase consisting of a nanocrystalline phase and an amorphous crystal phase.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will be described in detail, with reference to the accompanying drawings. At first, the technical points common to all embodiments will be described, and the inplane uni-directional magnetic anisotropy of a ferromagnetic film will be defined.

Figure 1:
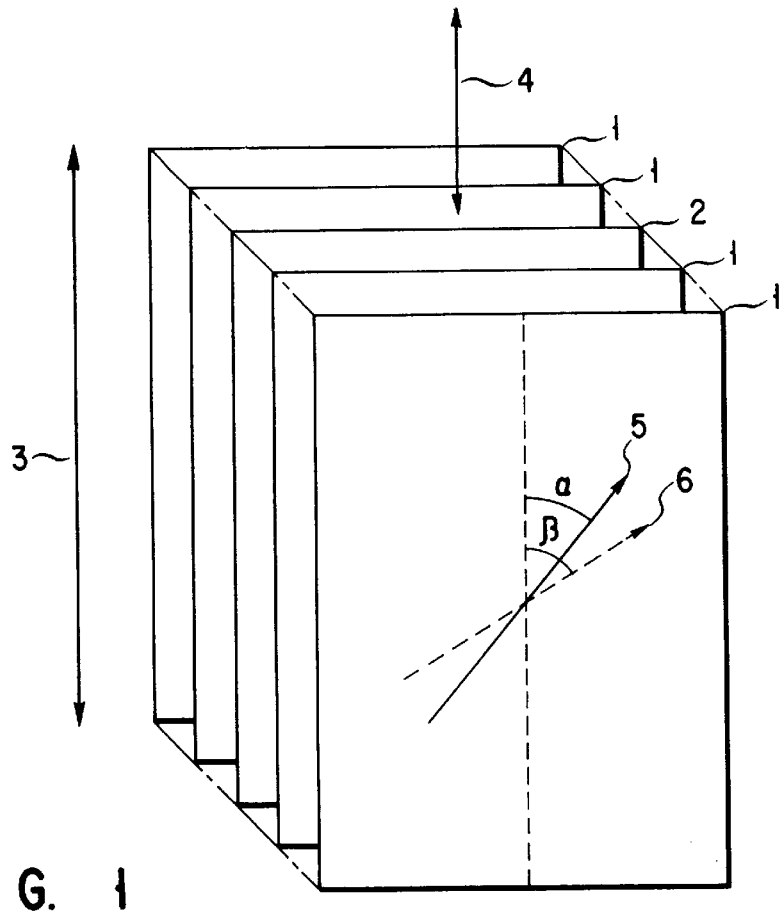
FIG. 1 is a schematic representation of a planer inductance element according to the present invention.

FIG. 1 is a schematic representation of a rectangular planer inductance element according to the invention. As shown in FIG. 1, the planar inductance element comprises four ferromagnetic films 1 and a conductor layer 2 of planar coil. The element has a principal-axis direction 3. An anisotropic stress 4 is applied to the planar inductance element. Each ferromagnetic film 1 has a magnetic easy direction 5, exhibiting inplane unidirectional magnetic anisotropy. Each ferromagnetic film 1 has another magnetic easy direction 6 defined by the energy of inplane magnetic anisotropy which is a composition of the magnetic anisotropy energy resulting from the anisotropic stress 4 and the magnetic anisotropy energy inherent in the ferromagnetic film 1.

In FIG. 1, $\alpha$ indicates the angle between the inplane magnetic easy direction 5 of a soft magnetic film exhibiting unidirectional magnetic anisotropy and the principal-axis direction 3 of the planar inductance element, and $\beta$ indicates the angle between the above-mentioned magnetic easy direction 6 and the principal-axis direction 3. FIG. 1 shows nothing more than an embodiment of the invention. According to the present invention, the number of the components, the shapes thereof, and the direction of the magnetic easy axis are not limited to those illustrated in FIG. 1.

The ferromagnetic films 1 will be described in detail, with reference to FIG. 1.

The magnetic anisotropy of a ferromagnetic film is defined by the shape of the film and the short-range ordering of the material of the film. A ferromagnetic film whose magnetic anisotropy thus defined and which has a magnetic easy axis extending in the plane of the film is said to have inplane uniaxial magnetic anisotropy. Short-range order such as directional ordering and the strain resulting from an anisotropic stress are typical examples of items that act upon the above-mentioned sort-range ordering, inducing uniaxial magnetic anisotropy.

Ordinary uniaxial magnetic anisotropy provides two magnetic easy directions which are parallel to the magnetic easy axis. The magnetic potentials in the two magnetic easy directions are equal. When a factor is introduced, a difference will develop between these magnetic potentials. Namely, one magnetic potential will be lower than the other magnetic potential. In the present specification, a ferromagnetic film with which this phenomenon occurs shall be said to have inplane unidirectional magnetic anisotropy.

If the external magnetic field for achieving magnetization reversal of another ferromagnetic film is more intense than the magnetic anisotropy filed of the ferromagnetic film described above, and if another ferromagnetic film may not undergo reversal of magnetization when used in a magnetic element together with the ferromagnetic film under a magnetostatic coupling condition, the ferromagnetic film can be said to aquire practical unidirectional magnetic anisotropy.

The ferromagnetic film described above may have exchange interaction with another ferromagnetic film or an antiferromagnetic film. In this case, the film may acquire unidirectional magnetic anisotropy, depending on its symmetry condition, no matter whether the interaction is ferromagnetic or antiferromagnetic.

How the inplane unidirectional magnetic anisotropy develops in the ferromagnetic film will be explained, with reference to FIG. 1.

Assume an external treatment is performed on the ferromagnetic film used in a rectangular planar inductance element, thereby applying an anisotropic stress 4 in parallel to the principal-axis direction 3 of the inductance element. In this case, new uniaxial magnetic anisotropy energy is generated in the ferromagnetic film. Once this energy is generated, the principal-axis direction 3 along which the stress 4 is applied becomes an easy axis or a hard axis. As a result, the uniaxial magnetic anisotropy energy is synthesized with the intrinsic inplane unidirectional magnetic anisotropy energy of the film. This develops a practical magnetic easy direction 6, which differs, as in most cases, from the magnetic easy direction 5 for the intrinsic inplane unidirectional magnetic anisotropy of the film.

Generally, the magnetic easy direction induced in a ferromagnetic film when the film receives an external treatment differs from the magnetic easy direction inherent in the unidirectional magnetic anisotropy already imparted to the film by any method. Nonetheless, these magnetic easy directions may be rendered identical by applying to the ferromagnetic film such magnetic and mechanical stresses as mentioned above. The value of the stress applied greatly influences the difference between the anisotropy energy in the easy direction and the anisotropy energy in the hard direction. Although the magnetic easy direction 5 is the same as the practical magnetic easy direction 6 developed by applying the stress 4 to the film, the anisotropy energies of the films are largely different for the magnetic easy directions 5 and 6. In the present specification, the ferromagnetic film is considered to exhibit inplane unidirectional magnetic anisotropy including the case described above.

Needless to say, the external treatment is to apply a thermal, magnetic or mechanical stress or any combination thereof to the ferromagnetic film during the manufacture of the planar inductance element incorporating the ferromagnetic film.

Assume that a ferromagnetic film is formed adjacent to an antiferromagnetic film or when a heat treatment in magnetic field performed on such a ferromagnetic film. In this case, effect of cooling in magnetic field is achieved at the antiferromagnetic film. The magnetic moment of the sub-lattice formed at the interface of the antiferromagnetic film and the magnetic moment near the ferromagnetic film undergo exchange interaction. Due to the exchange interaction, the magnetic moment at the ferromagnetic film may be subjected to compulsory alignment.

Material suitable for the antiferromagnetic film is Fe—Mn, Ni—Mn, Pd—Mn, Ir—Mn, Rh—Mn, Ru—Mn, Co—Mn, or an oxide of Fe, Co, Ni or the like.

The fixing effect of magnetic moment is a typical example of unidirectional magnetic anisotropy. Unidirectional magnetic anisotropy existing in the plane of a ferromagnetic film acts upon the high-frequency permeability in a similar manner as ordinary inplane uniaxial magnetic anisotropy. Unidirectional magnetic anisotropy provides a uniform magnetic domain structure. In view of this, it is more desirable than ordinary inplane uniaxial magnetic anisotropy.

A method has been described which imparts to a ferromagnetic film not only inplane uniaxial magnetic anisotropy, but also inplane unidirectional magnetic anisotropy. However, the present invention is not limited to a method of, or a structure for, inducing unidirectional magnetic anisotropy. The invention may be applied to a method of imparting to a ferromagnetic film an effective inplane unidirectional magnetic anisotropy achieved by combining the ferromagnetic film with a bulk magnetic circuit or a thin-film magnetic circuit, by means of static magnetic coupling between the ferromagnetic film and a hard magnetic film, or by means of the surface oxidation of the ferromagnetic film.

Not only inplane uniaxial magnetic anisotropy, but also inplane unidirectional magnetic anisotropy is controlled and imparted to a ferromagnetic film in the present invention. Hence, the principal axis and the magnetic easy direction of the planer inductance element of the invention can have such a relation as will suppress magnetic domain wall displacement in order to reduce the inductance loss and improve the high-frequency permeability. (It should be noted that the relation is determined by the shape of the ferromagnetic film in the conventional planar inductance element.)

In the present invention, various measures are taken to reduce the inductance loss and improve the high-frequency permeability. More precisely, the deterioration, variation and scattering of specification values are minimized during the manufacture, assembling and molding of a planer inductance element which incorporates the above-mentioned ferromagnetic film, so that the planar inductance element may meet the design specification. To minimize the deterioration, variation and scattering of specification values, the effective high-frequency permeability of the ferromagnetic film which imparts inductance to the planar inductance element, and the inductance loss in a high-frequency region are maintained at the design values.

The manufacture of a magnetic element includes some steps in which the unfinished product is heated to high temperatures. If an external magnetic field exists while the unfinished product remains at a high temperature, the characteristics of the magnetic element deviate from the design values. How much the characteristics deviate depends upon the magnetic field skew of the apparatus which generates the external magnetic field and the accuracy of the angle at which the substrate of the element is inclined to the external magnetic field. Hence, the direction of high-frequency magnetic excitation of the element may deviate from the macroscopic magnetic hard direction of the soft magnetic film, and the direction of high-frequency magnetic excitation at a specified part of the element may deviate from the direction of magnetic hard axis of the ferromagnetic film.

Even if no magnetic field is applied while the unfinished product remains at high temperature, the magnetic easy direction may be disturbed because of the magnetic anisotropy fixed due to the compulsory alignment of the magnetic moment at the ferromagnetic film, because of the demagnetization factor of the ferromagnetic film, or because of the circulation of magnetization. Even while the unfinished product remains at low temperature, the magnetic easy direction deviates from the designed one, due to the magnetoelastic energy induced by various stresses applied to the ferromagnetic film during the manufacture of the element or by the dispersion of stresses in the ferromagnetic film.

Due to the deviation of the magnetic easy direction, there is formed a 180-degree magnetic domain wall or the like, which does not intersect at right angles to, for example, the direction of magnetic hard axis. Consequently, a motive force is generated when high-frequency magnetic excitation is conducted on the ferromagnetic film. The motive forces displaces the magnetic domain wall, and an energy loss is inevitably made in the low-frequency region. Even in the high-frequency region where a magnetic domain wall is hardly displaced, the magnetic moment rotates at high speed in the magnetic domain, making another energy loss.

In order to find what measures be taken to provide a ferromagnetic film on which the best possible high-frequency excitation can be performed, a ferromagnetic film for use in a planar inductance element which is the first embodiment of the invention, and a ferromagnetic film for use in a comparative example 1 of in a planar inductance element were prepared by the same method described as follows.

A silicon wafer having a diameter of 125 mm and coated with a thermal oxide film was used as substrate for forming ferromagnetic films. Immediately before forming ferromagnetic films, the substrate was cleaned by means of dry etching using Ar gas. Two ferromagnetic films according to the present invention and two ferromagnetic films according to the comparative example 1 were formed on the substrate by using a magnetron sputtering apparatus. The thickness of each film formed on the substrate was measured with a probe-type surface roughness/film thickness meter. The high-frequency permeability of each film was measured by inductance method. The saturation magnetostriction constant of each film was evaluated by optical lever method. The common conditions of forming the ferromagnetic film were as shown in the following Table 1. Also shown in Table 1 are the conditions under which heat treatment in magnetic field was performed after the ferromagnetic film had been formed.

From Table 2 to 6 are shown detailed forming conditions, structures and performance of the ferromagnetic films according to the present invention and comparative examples.

The first embodiment of the invention will be described with reference to FIG. 1 and Tables 1 and 2.

In the first embodiment inplane unidirectional magnetic anisotropy is induced in the ferromagnetic film, in parallel to the longer sides of a rectangular inductance element. Assuming the ferromagnetic film had only inplane uniaxial magnetic anisotropy, the method of inducing the inplane unidirectional magnetic anisotropy, to cause the angle α and β both shown in FIG. 1 to become zero, shall be hereinafter referred to as "parallel unidirectional induction."

The parallel unidirectional induction suppresses the deviation of the magnetic hard orientation and magnetic easy orientation of the ferromagnetic and soft magnetic films constituting the planar inductance element. Therefore, the ferromagnetic film can have magnetic moments aligned with one another.

In the first embodiment of the invention, generation of an inverse magnetic domain, i.e., a 180-degree magnetic domain, is suppressed, thereby eliminating the magnetic domain wall. An energy loss can therefore be avoided which would otherwise result from the displacement of the magnetic domain wall. Unidirectional magnetic anisotropy may be induced in the ferromagnetic film prior to the manufacture of the planar inductance element. In this case, the deviation of the magnetic easy direction can be reduced in accordance with the intensity of the magnetic anisotropy induced.

Table 1 shows the materials, methods and treatment conditions, all used in forming the ferromagnetic films incorporated in the first embodiment and the comparative example 1.

The items shown in Table 1 are common to the other embodiments of the invention and the other comparative examples, which will be described later.

TABLE 1

Common condition for ferromagnetic and soft magnetic film formation

| | |
|---|---|
| Ferromagnetic film | Multiphase amorphous Fe—Co—B—C soft magnetic film |
| Film formation method | RF magnetron sputtering in Ar gas |
| Film thickness | 450 nm |

TABLE 1-continued

| | |
|---|---|
| Inplane magnetic field during film formation | 5.6 kA/m (permanent magnet) or zero |
| Common condition for underlying antiferromagnetic film formation | |
| Antiferromagnetic film | $Ir_{20}Mn_{80}$ |
| Film formation method | DC magnetron sputtering in Ar gas |
| Film thickness | 10 nm |
| Inplane magnetic field during film formation | 5.6 kA/m (permanent magnet) or zero |
| Common condition for protection film formation | |
| Protection film | AlN |
| Film formation method | Reactive Rf magnetron sputtering in mixed $N_2$ and Ar gas |
| Film thickness | 400 nm |
| Heat treatment in DC magnetic field after film formation | |
| DC magnetic field | 128 kA/m |
| Heat treatment temperature | 280° C. in vacuum |
| Heat treatment time | 86.4 ksec |
| Direction of DC magnetic field | Parallel to film plane |

Both the first embodiment and the comparative example 1 comprised an underlying antiferromagnetic film made of $Ir_{20}Mn_{80}$ and a ferromagnetic and soft magnetic film formed on the antiferromagnetic film. The ferromagnetic and soft magnetic film was a nanocrystalline phase and a multiphase amorphous Fe—Co—B—C film. The Fe—Co—B—C film had a saturation magnetostriction constant of about +20 ppm. The magnetic anisotropy field of the inplane uniaxial magnetic anisotropy induced in the film in a magnetic field exhibited an intensity of about 1.5 kA/m to 1.6 kA/m. The Fe—Co—B—C film underwent exchange interaction with the underlying antiferromagnetic film and acquired inplane unidirectional magnetic anisotropy. The inplane unidirectional magnetic anisotropy had an intensity of about 100 A/m to 150 A/m.

Two substrate wafers were prepared for the first embodiment, and two substrate wafers for the comparative example 1. A resin layer about 10 μm thick was coated on one of the two substrate wafers for the first embodiment by means of a spin coater. Similarly, a resin layer about 10 μm thick was coated on one of the two substrate wafers for the comparative example 1 by means of the spin coater. These substrate wafers were subjected to soft curing and then cut into rectangular samples of a first group by means of a dicer, each having a size of about 4 mm×8 mm.

Thereafter the rectangular samples of the first group were subjected to curing. The soft curing and the curing were, so to speak, a simulated first process which should be performed on a ferromagnetic film so that the film may be applied to a planer inductance element. The lengthwise direction of each rectangular sample can be regarded as the direction of principal axis 3 of the planar inductance element illustrated in FIG. 1.

As a result of the first process, a tensile stress developed in the resin layer of each sample. Each sample of the first group was therefore bent to have a concave surface. Linear cracks were observed perpendicular to the lengthwise direction in the resin layer. This suggests that some of the tensile stress applied on the resin layer in the lengthwise direction of the sample was released due to the first process.

Setting the inplane isotropic component of the stress aside, an anisotropic compressive stress was considered to act on the rectangular sample in the direction perpendicular to the lengthwise direction of the sample. Namely, a tensile stress appeared to generated to pull the sample of the first group in a direction parallel to the lengthwise direction of the sample.

The other of the two substrate wafers for the first embodiment was not subjected to resign-layer coating or cure treatment. Nor was the other of the two substrate wafers for the comparative example 1 subjected to resign-layer coating or cure treatment. These substrate wafers were cut into rectangular samples of the second group by means of the dicer, each having a size of about 4 mm×8 mm. Using the samples of the second group as reference, the effect of the tensile stress applied to each sample of the first group was normalized. On the basis of the normalized effect of tensile stress, the samples of the first group were evaluated for their high-frequency excitation properties.

The normalization of stress effect was conducted in the same way on the other embodiments of the present invention and the other comparative examples, which will be described later.

A magnetic field having an excitation frequency of 1 MHz was applied to the rectangular samples of the first group. The high-frequency permeability thus measured is equivalent to the effective high-frequency permeability of a planar inductance element to be manufactured by subjecting the sample of the first group to various processes.

Table 2 shows the structure, treatment conditions, high-frequency permeability, loss in the high frequency range, i.e., tan$\delta$ where $\delta$ is the loss angle, and the like of the ferromagnetic film incorporated in the first embodiment of the invention. Table 2 also shows the structure, treatment conditions, high-frequency permeability, tan$\delta$ and the like of the ferromagnetic film used in the comparative example 1, for the purpose of comparison.

TABLE 2

| Film structure, treatment conditions and high frequency properties | 1st embodiment | Comparative example 1 |
| --- | --- | --- |
| Underlying anitferro-magnetic film | Yes | No |
| Direction of inplane magnetic field during underlying film formation | $\alpha = 0$ deg. | —* |
| Magnetic field applied during ferromagnetic and soft magnetic film formation | No | No |
| Upper protection film | Yes | Yes |
| Heat treatment after film formation | Yes | Yes |
| Direction of inplane magnetic field during heat treatment after film formation | $\alpha = 0$ deg. | $\alpha = 0$ deg. |
| Normalized permeability in high frequency range after manufacturing process | $\mu = 0.72$ | $\mu = 0.69$ |
| Loss in high frequency range | tan $\delta = 0.021$ | tan $\delta = 0.52$ |

*Mark "—" shows no corresponding item exists for omparative example 1.

The high-frequency permeability and tan$\delta$ shown in Table 2 are of the values normalized by using, as reference, the samples of the second group which were subjected to neither resin-layer coating nor cure treatment. It should be noted that tan$\delta$ was obtained by dividing the real part of the high-frequency permeability by the imaginary part thereof.

As can be seen from Table 2, the ferromagnetic film of the first embodiment is stacked on the underlying antiferromagnetic film. The unidirectional magnetic anisotropy was thereby developed in the film by the compulsory alignment of magnetic moment. The direction in which an inplane magnetic field was applied during the forming of the antiferromagnetic film and the heat treatment conducted on this film thereafter is identified by an angle $\alpha$. This angle $\alpha$ was 0°.

The comparative example 1 is identical with the first embodiment, except that it has no underlying antiferromagnetic film. Hence, the effect resulting from the inplane unidirectional magnetic anisotropy induced by the compulsory alignment of magnetic moment which is achieved by the antiferromagnetic film can be detected when the first example is compared with the comparative example 1. The comparison between the comparative example 1 and the first embodiment can be regarded as comparison between the conventional ferromagnetic film and the ferromagnetic film used in the first embodiment, because the conventional ferromagnetic film has no underlying antiferromagnetic film.

The results shown in Table 2 reveal that the method of inducing inplane unidirectional magnetic anisotropy in parallel to the longer sides of the first embodiment (i.e., a rectangular planar inductance element) served to reduce tan$\delta$ after the ferromagnetic film had been damaged during the manufacture of the first embodiment. In other words, this method is proved to be effective in realizing a low-loss rectangular planer inductance element.

A deformed example of the first embodiment was made, in which the inplane unidirectional magnetic anisotropy deviated a little because of changes in manufacturing method or an inplane stress was applied at an angle (e.g., $\alpha=5°$) to the principal axis. Table 3 shows the structure, treatment conditions, high-frequency permeability, tan$\delta$ and the like of the ferromagnetic film incorporated in the deformed example. Shown also in Table 2 are the structure, treatment conditions, high-frequency permeability, tan$\delta$ and the like of the ferromagnetic film used in a comparative example 2, for the purpose of comparison.

TABLE 3

| Film structure, treatment conditions and high frequency properties | Deformed example of 1st embodiment | Comparative example 2 |
| --- | --- | --- |
| Underlying antiferromagnetic film | Yes | No |
| Direction of inplane magnetic field during underlying film formation | $\alpha = 5$ deg. | — |
| Magnetic field applied during ferromagnetic and soft magnetic film formation | Yes | No |
| Direction of magnetic field during ferromagnetic and soft magnetic film formation | $\alpha = 5$ deg. | — |
| Upper protection film | Yes | Yes |
| Heat treatment after film formation | No | Yes |
| Direction of inplane magnetic Field during heat treatment after film formation | $\alpha = 5$ deg. | $\alpha = 5$ deg. |
| Normalized permeability in high frequency range after manufacturing process | $\mu = 0.73$ | $\mu = 0.66$ |
| Loss in high frequency range | tan $\delta = 0.021$ | tan $\delta = 0.062$ |

The deformed example is different from the first embodiment in that no heat treatment was performed after the ferromagnetic film had been formed. In view of this, the deformed example cannot be said to have been made under exactly the same treatment conditions as the comparative example 2. Nonetheless, as seen from Table 3, the deformed example of the first embodiment is proved to be advantageous over the comparative example 2.

A rectangular planer inductance element which is the second embodiment of the invention will be described, with reference to FIGS. 2 to 6 and Table 4. The second embodiment is characterized in that inplane unidirectional magnetic anisotropy is induced in the ferromagnetic film in a direction at about 30° or about 60° to the longer sides of the inductance element. The induction of this magnetic anisotropy shall be called "tilted unidirectional induction."

Thanks to the tilted unidirectional induction, the change in the effective high-frequency permeability is substantially nil even if a compressive stress or a tensile stress is applied along the inplane principal axis of the planar inductance element during the manufacture thereof. That is, virtually no change occurs in the inductance of the element in spite of the compressive or tensile stress so applied to the element. In other words, the second embodiment of the invention has enhanced immunity for process treatment. Further, the deviation of the magnetic hard and easy orientations of the soft magnetic film is suppressed in the second embodiment as in the first embodiment.

Generally, the inplane anisotropic stress applied to a planar inductance element is closely correlated with the external shape of the element, the shape of the coil film and the symmetry of the ferromagnetic film. To make use of the magnetic excitation along the magnetic hard axis of the ferromagnetic film, it is natural that the coil and the inductor should be rectangular. If an inductance element is formed on a wafer by utilizing the semiconductor thin film process, it is usually rectangular so that the substrate dicing may be easily carried out and the yield of the element may be increased. Hence, an anisotropic stress, if any, introduced in the plane of the ferromagnetic film will act a direction either parallel or perpendicular to the lengthwise direction (i.e., the principal axis) of the element in most cases.

Assume that a stress which is anisotropic in a plane parallel or perpendicular to the longer axis of an inductor is introduced in the ferromagnetic film of the inductor which exhibits inplane unidirectional magnetic anisotropy and which therefore has a magnetic easy axis inclined at angle α to the longer axis of the inductor. In this case, the main component of the magnetic anisotropy and the main component of the magnetic anisotropy induced by the stress are combined, and the ferromagnetic film acquires a new magnetic easy direction and an inplane magnetic anisotropy energy.

In other words, the magnetic anisotropy of the ferromagnetic film, imparting to the film the magnetic easy axis inclined at angle α, does greatly changes in both magnitude and direction. The magnitude of the resultant inplane magnetic anisotropy and the magnetic easy direction are expressed in the equations (1) and (2), in terms of trigonometric functions. From equations (1) and (2), the effective high-frequency permeability which the magnetic film exhibits when driven by the magnetic field generated by the rectangular coil and which contributes to the inductance of the planar inductance element is expressed in the following equation (3). The effective high-frequency permeability developed by virtue of rotation magnetization process is known as "reversible initial permeability."

$$\beta = \sin^{-1}\left[\sin 2\alpha \cdot \left\{1 + \left(\frac{E_1}{E_0}\right)^2 + 2\frac{E_1}{E_0}\cos 2\alpha\right\}^{-\frac{1}{2}}\right] \quad (1)$$

$$E_a = (E_0^2 + E_1^2 + 2E_0 E_1 \cos 2\alpha)^{\frac{1}{2}} \quad (2)$$

$$\hat{\mu} = \sin^2\left(\frac{\pi}{2} - \frac{1}{2}\sin^{-1}\left[\sin 2\alpha \cdot \left\{1 + \left(\frac{E_1}{E_0}\right)^2 + 2\frac{E_1}{E_0}\cos 2\alpha\right\}^{-\frac{1}{2}}\right]\right) \cdot \quad (3)$$

$$\left(1 + \left(\frac{E_1}{E_0}\right)^2 + 2\frac{E_1}{E_0}\cos 2\alpha\right)^{-\frac{1}{2}}$$

In equations (1), (2) and (3), α is the angle between the magnetic easy direction of inplane unidirectional magnetic anisotropy and the lengthwise direction of the planar inductance element. β is the angle between the magnetic easy direction of magnetic anisotropy energy $E_a$ and the lengthwise direction of the inductance element. $E_0$ is the inplane unidirectional magnetic anisotropy energy, and $E_1$ is the anisotropic magnetoelastic energy introduced by virtue of the anisotropic stress applied in the plane of the ferromagnetic film. $E_a$ is magnetic anisotropy energy composed of energy $E_0$ and energy $E_1$, i.e., the energy defined by the 2 θ term for uniaxial magnetic anisotropy. Further, $\mu$ (hat) is the normalized effective permeability, i.e., the effective high-frequency permeability normalized by using, as reference, the high-frequency permeability which the conventional inductance element exhibits along the magnetic hard axis when applied with no anisotropic stress.

The inventor hereof conducted numerical calculation to determine how the initial permeability depends upon the value of α. Almost no changes in the initial permeability are observed as the stress was varied, when α was about 30°. This reveals that a planar inductance element can be manufactured whose high-frequency permeability has high process immunity and whose properties accord with the design specification.

Figure 2:
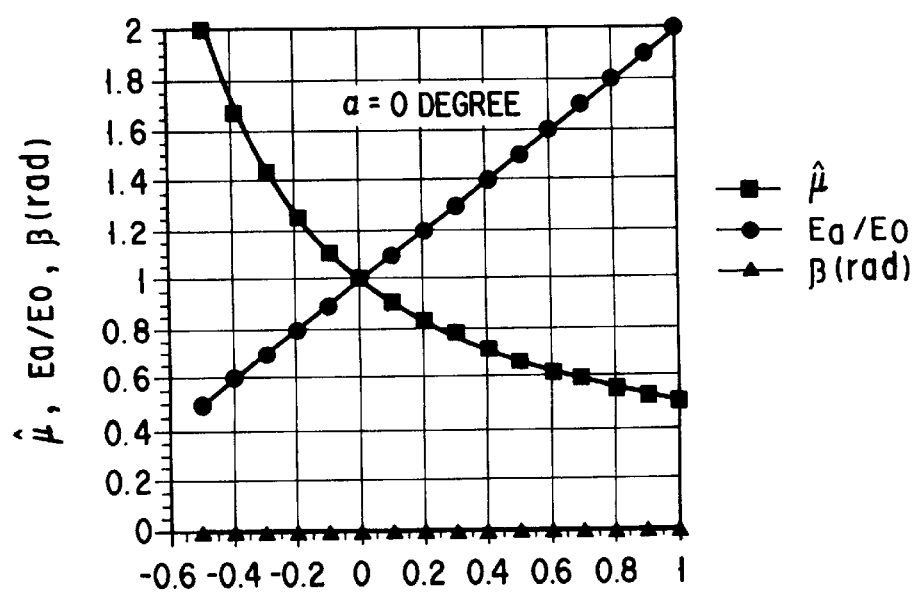
FIG. 2 is a graph showing how $\mu(hat)$, $E_a/E_0$ and $\beta(rad)$ depend on $E_1/E_0$ when $\alpha=0°$.

FIG. 2 shows how $\mu$(hat), $E_a/E_0$ and β(rad) depend on $E_1/E_0$ when α=0°. Here, β(rad) is the angle indicating the direction of the composite inplane anisotropy energy $E_a$, and $E_1/E_0$ is the anisotropic stress applied in the magnetic easy direction. As can be understood from FIG. 2, β=0° even if $E_1/E_0$ changes, when α=0°. This corresponds to the case where parallel unidirectional magnetic anisotropy is inducted in the first embodiment. As seen from FIG. 2, β(hat) decreases with the anisotropic stress applied in the magnetic easy direction, as $E_1/E_0$ approaches zero. Thus, in the first embodiment, $\mu$(hat) deviates from the normalized value of 1, though tanδ can be reliably reduced after the ferromagnetic film is damaged in the manufacturing process.

Figure 3:
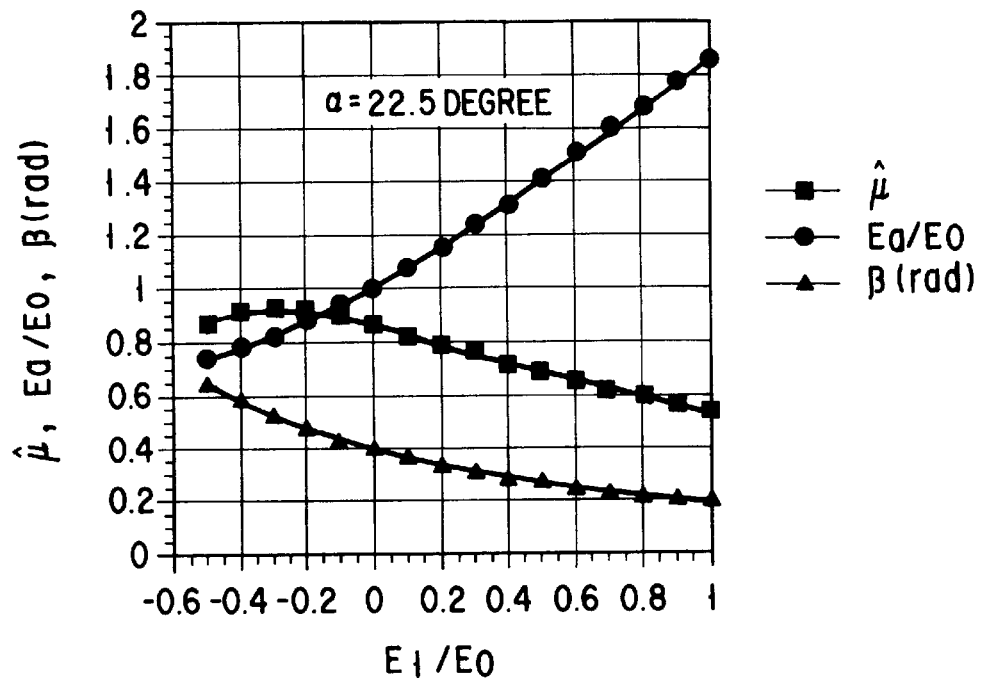
FIG. 3 is a graph illustrating how $\mu(hat)$, $E_a/E_0$ and $\beta(rad)$ depend on $E_1/E_0$ when $\alpha=22.5°$.

FIG. 3 illustrates how $\mu$(hat), $E_a/E_0$ and β(rad) depend on $E_1/E_0$ when α=22.5°. As can be understood from FIG. 3, $\mu$(hat) decreases with $E_1/E_0$ at a low rate when $E_1/E_0$ is about zero.

Figure 4:
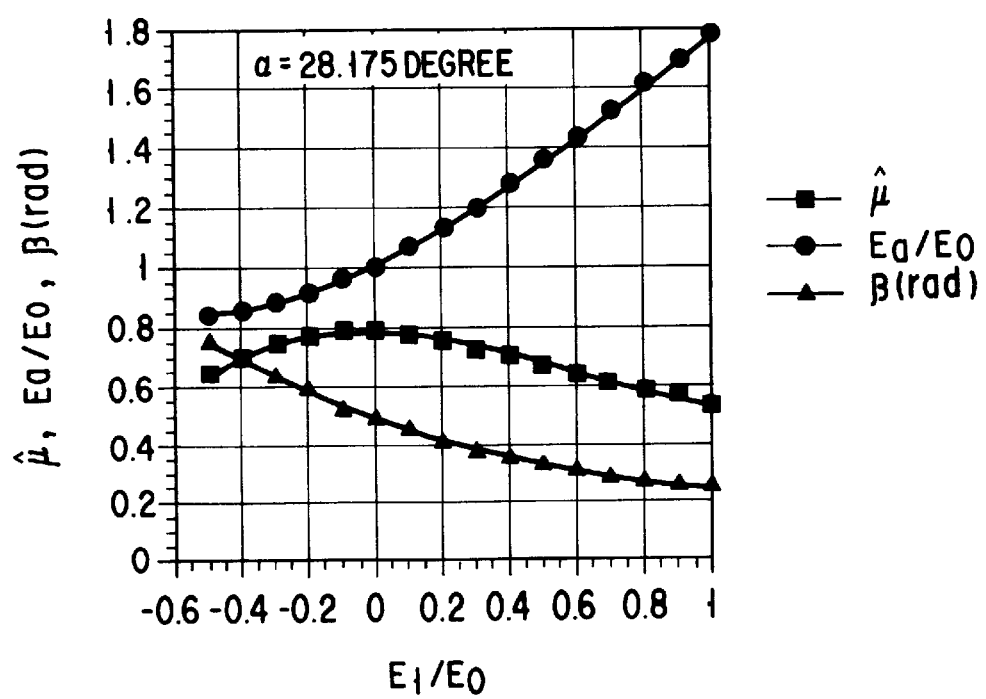
FIG. 4 is a graph illustrating how $\mu(hat)$, $E_a/E_0$ and $\beta(rad)$ depend on $E_1/E_0$ when $\alpha=28.175°$.

FIG. 4 shows how $\mu$(hat), $E_a/E_0$ and β(rad) depend on $E_1/E_0$ when α=28.175°. As seen from FIG. 4, $\mu$(hat) decreases with $E_1/E_0$ when $E_1/E_0$ is about 0, at a rate lower than in the case where α=22.5° (FIG. 3).

Figure 5:
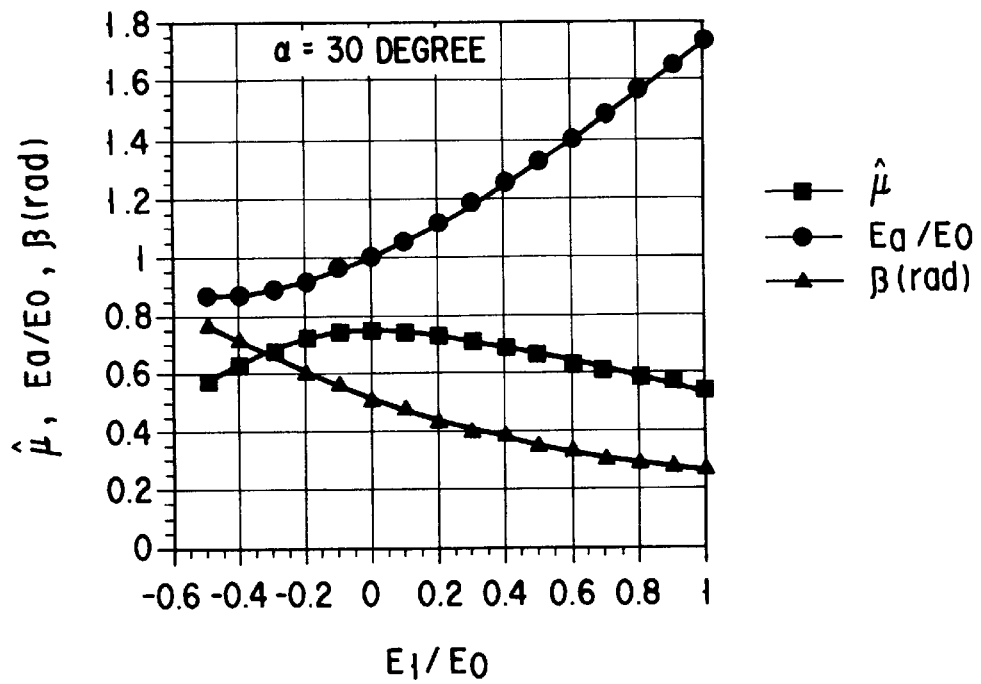
FIG. 5 is a graph illustrating how $\mu(hat)$, $E_a/E_0$ and $\beta(rad)$ depend on $E_1/E_0$ when $\alpha=30°$.

FIG. 5 shows how $\mu$(hat), $E_1/E_0$ and β(rad) depend on $E_1/E_0$ when α=30°. As can be understood from FIG. 5, $\mu$(hat) attains the maximum value when $E_1/E_0$=0. This means that the rate at which $\mu$(hat) changes with $E_1/E_0$ becomes zero when $E_1/E_0$ is about zero.

Figure 6:
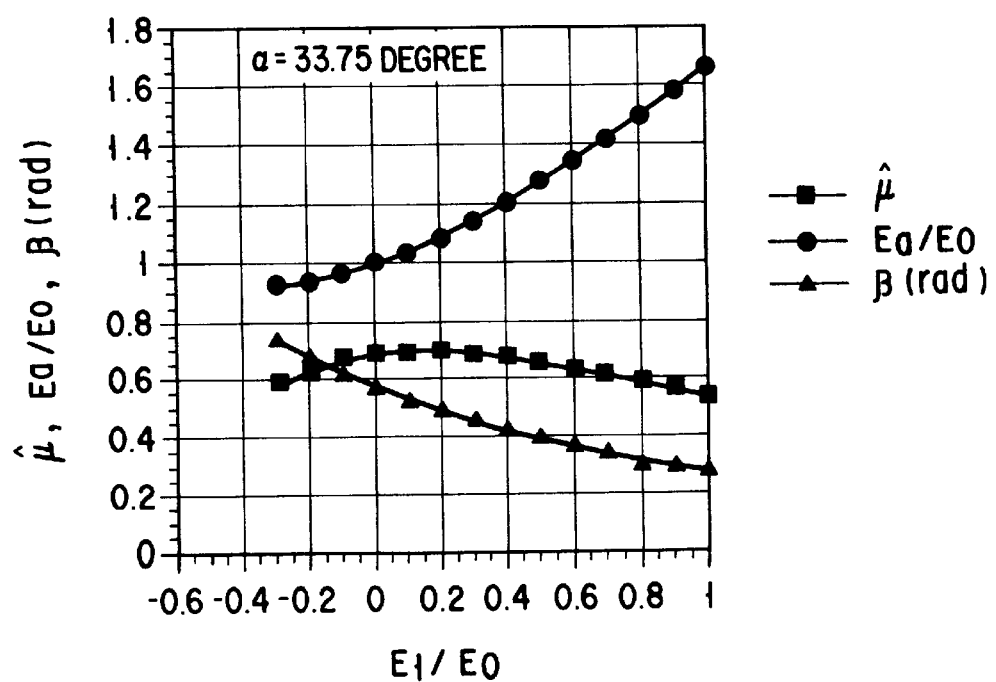
FIG. 6 is a graph illustrating how $\mu(hat)$, $E_a/E_0$ and $\beta(rad)$ depend on $E_1/E_0$ when $\alpha=33.75°$.

FIG. 6 illustrates how $\mu$(hat), $E_a/E_0$ and β(rad) depend on $E_1/E_0$ when α=33.75°. As is clear from FIG. 6, $\mu$(hat) gradually increases as $E_1/E_0$ approaches zero.

The analysis described above shows that $\mu$(hat) has the highest process immunity to the anisotropic stress $E_1/E_0$ (i.e., the external stress applied in the magnetic easy direction during the manufacture of the element), if α=30°. This finding was verified as described later.

TABLE 4

| Film structure, treatment conditions and high frequency properties | 2nd embodiment | 1st embodiment | Comparative example 3 | Comparative example 4 | Comparative example 5 |
|---|---|---|---|---|---|
| Underlying anitferromagnetic film | Yes | Yes | Yes | Yes | No |
| Direction of inplane magnetic field during underlying film formation | α = 30 deg. | α = 0 deg. | α = 20 deg. | α = 40 deg. | — |
| Magnetic field applied during ferromagnetic and soft magnetic film formation | No | No | No | No | No |
| Upper protection film | Yes | Yes | Yes | Yes | Yes |
| Heat treatment after film formation | Yes | Yes | Yes | Yes | Yes |
| Direction of inplane magnetic field during heat treatment after film formation | α = 30 deg. | α = 0 deg. | α = 20 deg. | α = 40 deg. | α = 30 deg. |
| Normalized permeability in high frequency range after manufacturing process | μ = 0.94 | μ = 0.72 | μ = 0.77 | μ = 1.13 | μ = 0.86 |
| Loss in high frequency range | tan δ = 0.026 | tan δ = 0.021 | tan δ = 0.025 | tan δ = 0.029 | tan δ = 0.076 |

An anisotropic compressive stress and an anisotropic tensile stress are equivalent to each other when they are applied in the same plane in directions which are different by 90°. Therefore, it is self-evident that μ(hat) can have high process immunity, too, if α is about 60°.

As indicated above, an inplane anisotropic stress is applied during the manufacture of a planar inductance element, either parallel or perpendicular to the principal axis of the element. As described above, too, the effective high-frequency permeability of the element changes a little with the anisotropic stress if the inplane anisotropic stress is applied at 30° or 60° to the magnetic easy direction. In view of these, the effective high-frequency permeability of the soft magnetic film which is used in a planar inductance element and which has an inplane magnetic easy direction which inclines at 30° or 60° to the principal axis of the element can be said to exhibit high process immunity.

This essential characteristic is attained if the magnetic film has not only unidirectional magnetic anisotropy but also inplane uniaxial magnetic anisotropy. A magnetic film having such a tilted magnetic easy axis has a 180° magnetic domain wall as mentioned above. The 180° magnetic domain wall acquires a motive force when high-frequency excitation is applied. The motive force results in a so-called anomalous loss in the magnetic film. No anomalous loss occurs in the ferromagnetic film of this invention, which has inplane unidirectional magnetic anisotropy. The effective high-frequency permeability of the ferromagnetic film, which has high process immunity, can therefore be fully utilized.

According to the second embodiment of the present invention, inplane unidirectional magnetic anisotropy is induced at an angle of about 30° or about 60° to the longer axis of the rectangular planar inductance element. This shall be hereinafter referred to as "tilted uniaxial induction."

Table 4 shows the structures, treatment conditions, high-frequency permeabilities, and tan δ of the ferromagnetic films incorporated in the first and second embodiments of the invention. Also shown in Table 2 are the structures, treatment conditions, high-frequency permeabilities, and tan δ of the ferromagnetic films used in comparative examples 3 to 5, for the purpose of comparison.

As seen from Table 4, the ferromagnetic film of the second embodiment, which had been subjected to tilted unidirectional induction, exhibited normalized effective permeability of nearly 1, and the second embodiment had tan δ comparable with that of the first embodiment. As Table 4 shows, the first and second embodiments are different only in the angle α between the magnetic easy direction of inplane unidirectional magnetic anisotropy and the lengthwise direction of the rectangular planar inductance element. Thus, the tilted unidirectional induction imparted higher process immunity to the film than parallel unidirectional induction. In brief, the tilted unidirectional induction is a method of inducing magnetic moment, which is superior to parallel to parallel unidirectional induction.

Comparison of the first embodiment, second embodiment, example 2 and example 3 reveals that normalized effective permeability μ changed as angle α changed from 0° to 20° and then to 40°, almost along the theoretical μ(had) curves illustrated in FIGS. 2, 3 and 5. From Table 4 it is seen that the process immunity increased as the angle α approached 30°, as had been expected. The data of Table 4 is believed to fully verify the results of the theoretical analysis.

Let us compare the second embodiment is compared with the comparative example 5, with reference to the data shown in Table 4. It will then be found that without an underlying antiferromagnetic film, tan δ greatly deteriorates (increases) even if angle α is 30°. This means that no inplane unidirectional magnetic anisotropy can be attained unless compulsory alignment of magnetic moment occurs while the ferromagnetic film is being formed.

As has been described, the following points have been confirmed. First, the ferromagnetic film used in the planar inductance element and having an inplane magnetic easy direction which inclines at about 30° to the principal axis of the element excellent in suppressing the changes in the permeability which occur when an inplane anisotropic stress is applied during the manufacture of the element. Second, the ferromagnetic film serves to improve the process immunity of the element even if its inplane magnetic easy direction inclines at 40° or 20°, unlike the conventional ferromagnetic film which has a magnetic easy axis parallel to the principal axis of the rectangular inductance element. Third, tanδ greatly deteriorates even if the angle α is 30°, unless inplane unidirectional magnetic anisotropy is attained.

The third and fourth embodiments of the invention, either being a planar inductance element, will be described, with reference to the following Table 5.

TABLE 5

| Film structure, treatment conditions and high frequency properties | 3rd embodiment | 4th embodiment |
|---|---|---|
| Underlying antiferromagnetic film | Yes | Yes |
| Direction of inplane magnetic field during underlying film formation | α = 30 deg. | α = 30 deg. |
| Magnetic field applied during ferromagnetic and soft magnetic film formation | Yes | Yes |
| Direction of magnetic field during Ferromagnetic and soft film formation | α = 30 deg. | α = 30 deg. |
| Upper protection film | Yes | Yes |
| Heat treatment after film formation | No | No |
| Underlying antiferromagnetic film (newly formed) | Yes | Yes |
| Direction of inplane magnetic field during underlying film formation | α = −30 deg. | α = −30 deg. |
| Magnetic field applied during ferromagnetic and soft magnetic film formation | Yes | Yes |
| Direction of magnetic field during ferromagnetic and soft magnetic film formation | α = −30 deg. | α = −30 deg. |
| Upper protection film | Yes | Yes |
| Heat treatment after film formation | No | No |
| Underlying antiferromagnetic film (newly formed) | — | Yes |
| Direction of inplane magnetic field during underlying film formation | — | α = 45 deg. |
| Magnetic field applied during ferromagnetic and soft magnetic film formation | — | Yes |
| Direction of magnetic field during ferromagnetic and soft magnetic film formation | — | α = 45 deg. |
| Upper protection film | — | Yes |
| Heat treatment after film formation | — | No |
| Underlying anti ferromagnetic film (newly formed) | — | Yes |
| Direction of inplane magnetic field during underlying film formation | — | α = −45 deg. |
| Magnetic field applied during ferromagnetic and soft magnetic film formation | — | Yes |
| Direction of magnetic field during ferromagnetic and soft magnetic film formation. | — | α = −45 deg. |
| Upper protection film | — | Yes |
| Heat treatment after film formation | — | No |
| Normalized permeability in high frequency range after manufacturing process | μ = 0.95 | μ = 1.24 |
| Loss in high frequency range | tan δ = 0.027 | tan δ = 0.024 |

The third embodiment comprises a plurality of thin magnetic films which have different unidirectional magnetic anisotropies. The thin magnetic films are stacked, either one on another or one above another. These films are so combined as to maintain the permeability of the planar inductance element at a prescribed value and to minimize the magnetoelastic loss in the element.

The third embodiment may have three ferromagnetic films which have magnetic easy directions inclined at 0°, +45° and −45°, respectively, to the principal axis. If the effective permeability of the film having the magnetic easy direction inclined at 0° to the principal axis increases, the films which have magnetic easy directions inclined at +45° and −45° to the principal axis will have their effective permeabilities decreased. Thus, the total effective permeability of the three ferromagnetic films remains constant, provided that the volume ratio between these films is optimized.

Alternatively, the third embodiment may have two ferromagnetic films having magnetic easy directions inclined at +30° and −30°, respectively, to the principal axis of the planer inductance element. In this case, the effective permeability is substantially constant regardless of the anisotropic stress applied along the principal axis of the element. Furthermore, even if the orientation of the anisotropic stress deviates by some degree from the principal axis, the effective permeability of one film decreases, while that of the other film increases. Hence, the third embodiment can have higher process immunity than a planar inductance element which comprises a ferromagnetic film which has magnetic easy direction inclined at +30° to the principal axis.

Still alternatively, the third embodiment may have two ferromagnetic films having magnetic easy directions inclined at +45° and −45°, respectively, to the principal axis. In this case, the spontaneous magnetoelastic energies in these two magnetic easy directions substantially cancel out each other. Thus, only if the ferromagnetic films are stacked one upon the other, the strain exerted on the crystal lattice will no changes so much when a magnetic moment is driven by high-frequency excitation. This makes it possible to reduce the energy loss which accompanies the exchange of energy in magnetomechanical coupling.

The third embodiment whose particulars are shown in Table 5, comprises two ferromagnetic films which are stacked one on the other and which have magnetic easy directions inclined at +30° and −30°, respectively, to the principal axis. On the other hand, the fourth embodiment whose particulars are shown also in Table 5 comprises additional two ferromagnetic films which are stacked one on the other and which have magnetic easy directions inclined at +45° and −45°, respectively, to the principal axis.

With both the third embodiment and the fourth embodiment, either having two inplane unidirectional magnetic anisotropic films which differ in orientation, it is possible not only to suppress changes in the high-frequency permeability which result from an inplane anisotropic stress applied, but also to prevent the energy loss from increasing. As seen from Table 5, the ferromagnetic films of the fourth embodiment has tanδ smaller than the ferromagnetic films of the third embodiment. One of the reasons why may be that the loss caused by the spontaneous strain which has resulted from magnetoelastic energy is suppressed.

As indicated above, a planar inductance element may comprise a soft magnetic thin film which has a considerably large magnetoelastic energy and at least one inplane unidirectional magnetic anisotropy film which exhibit specific high frequency permeability when applied with an anisotropic stress during the manufacture of the element. The soft magnetic thin film and the magnetic anisotropy film can constitute a soft magnetic and ferromagnetic film whose effective high-frequency permeability is hardly affected by the inplane anisotropic stress, if any, applied to the magnetic anisotropy film.

In other words, the present invention can provide a planer inductance element whose inductance hardly change with time or hardly deviates from the design value. Namely, it is possible to manufacture a ferromagnetic film excelling in controllability, exhibiting high process immunity and having properties almost as designed, and a planar inductance element which has a ferromagnetic film of this type.

Figure 7A:
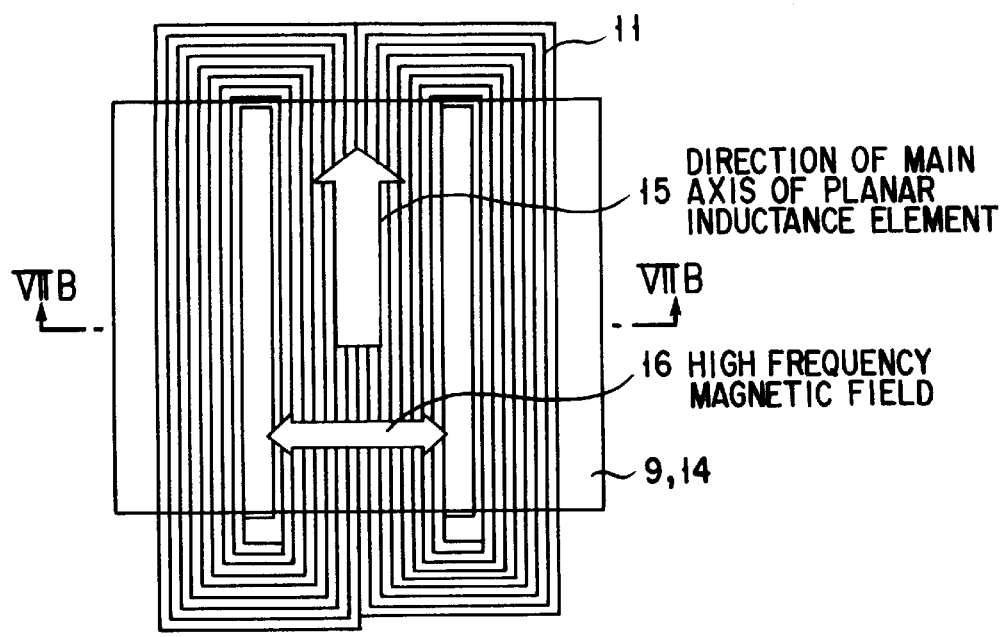
FIG. 7A is a representation of a planar inductance element according to the present invention.
Figure 7B:
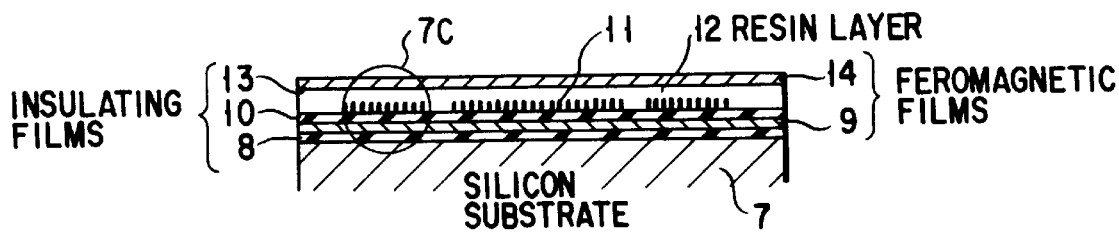
FIG. 7B is a sectional view of the planar inductance element, taken along line VIIB—VIIB in FIG. 7A.
Figure 7C:
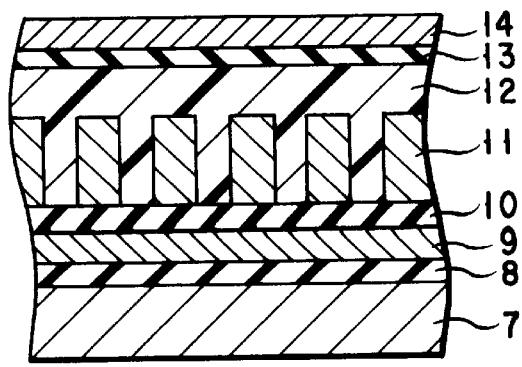
FIG. 7C is an enlarged sectional view of a part of the planar inductance element, taken along line VIIB—VIIB in FIG. 7A.

The fifth embodiment of the invention will be described with reference to FIGS. 7A to 7C and Table 6.

TABLE 6

| Film structure, treatment conditions and high frequency properties | 5th embodiment | Comparative example 6 |
|---|---|---|
| Underlying antiferromagnetic film | Yes | No |
| Direction of inplane magnetic field during underlying film formation | α = 30 deg. | — |
| Magnetic field applied during ferromagnetic and soft magnetic film formation | Yes | No |
| Direction of magnetic field during ferromagnetic and soft magnetic film formation | α = 30 deg. | — |
| Upper protection film | Yes | Yes |
| Heat treatment after film formation | No | Yes |
| Direction of inplane magnetic field during heat treatment after film formation | — | α = 0 deg. |
| Underlying antiferromagnetic film (newly formed) | Yes | No |
| Direction of inplane magnetic field during underlying film formation | α = −30 deg. | — |
| Magnetic field applied during ferromagnetic and soft magnetic film formation | Yes | No |
| Direction of magnetic field during ferromagnetic and soft magnetic film formation | α = −30 deg. | — |
| Upper protection film | Yes | Yes |
| Heat treatment after film formation | No | Yes |
| Direction of inplane magnetic field during heat treatment after film formation | — | α = 0 deg. |
| Normalized permeability in high frequency range after manufacturing process | μ = 0.95 | μ = 0.69 |
| Loss in high frequency range | tan δ = 0.027 | tan δ = 0.052 |
| Normalized inductance after manufacturing process | 0.95 | 0.85 |
| Q value | 5.5 | 2.8 |

A planar inductance element according to the fifth embodiment was made by forming ferromagnetic films on a substrate wafer in the same way as in the manufacture of the third embodiment. How the element was manufactured will be explained with reference to FIGS. 7A to 7C.

First, a first ferromagnetic film 9 was formed on a silicon substrate 7 which had been coated with a thermal oxide film 8. Sputtering was performed, forming an $SiO_2$ film 10 on the first ferromagnetic film 9. An underlying electrode for plating was formed by means of sputtering. Cu plating was then carried out, forming a copper layer on the $SiO_2$ film 10. The copper layer is patterned by photolithography and selective wet etching, thereby forming a conductor coil 11. That is, the copper layer was exposed to light-applied through a mask pattern, and its light-exposed parts were wet-etched.

Next, polyimide was applied by a spin coater, forming a resin layer 12 on the conductor coil 11, filling the gaps among the turns of the coil 11. A protective film 13 of AlN was formed on the resin layer 12. Further, a second ferromagnetic film 14 was formed on the protective film 13. It should be noted that both ferromagnetic films 8 and 14 were formed in the same way as in the third embodiment described above.

Thereafter, the second ferromagnetic film 14 was patterned by photolithography and selective wet etching, thereby exposing the electrodes of the coil 11. Each ferromagnetic film was cut into pieces by means of wet etching; each piece will be a component of one planar inductance element. Finally, the resultant structure is cut by means of dicing, into planar inductance elements.

A comparative example 6, or a planar inductance element, was made by forming two ferromagnetic films on a substrate wafer in the same way as in the manufacture of the comparative example 1, by coating resin on the wafer, by heat-treating the wafer and by dicing the resultant structure.

Table 6 shows the structures, treatment conditions, high-frequency permeabilities, tanδ and the like of the ferromagnetic films incorporated in the fifth embodiment. Also shown are the structures, treatment conditions, high-frequency permeabilities, tanδ and the like of the ferromagnetic films incorporated in the comparative example 6.

The ferromagnetic films of the comparative example 6 were made by the conventional method, whereas the ferromagnetic films were formed by a complicated method and had a complex structure. Nonetheless, as seen from Table 6, the fifth embodiment is better than the comparative example 6 in terms of high-frequency properties μ and tanδ. Obviously, the fifth embodiment exhibits high process immunity.

Set forth in the lower part of Table 6 are the normalized inductance (obtained by normalizing the measured inductance with the design value), and quality factor Q (at 1 MHz) of the fifth embodiment. Also shown in the lower part of Table 6 are the normalized inductance and quality factor Q (at 1 MHz) of the fifth embodiment. As is evident from Table 6, the fifth embodiment had inductance of 0.95 which was very similar to the design value. In addition, the Q value of the fifth embodiment was very large, about twice the Q value of the comparative example 6.

As has been described above, inplane unidirectional magnetic anisotropy has been induced in the ferromagnetic films according to the invention. The ferromagnetic films have been found to not only excel in high-saturation magnetization and soft magnetism, but also to impart high process immunity to the ferromagnetic and soft magnetic film.

Each of the planar inductance elements (i.e., the first to fifth embodiments) which incorporate ferromagnetic films according to the present invention has proven to exhibit effective high-frequency permeability which is similar to the design value and which hardly changes during the manufacture of the element. By contrast, the planar inductance elements (i.e., comparative examples 1 to 6) which incorporate the conventional ferromagnetic films has proven to effective high-frequency permeability which greatly changes when an inplane anisotropic stress is applied, and fails to acquire such characteristics as designed.

The present invention is not limited to the embodiments described above. Fe—Co—B—C soft magnetic film is used in the embodiments to form a ferromagnetic film. Instead, a 5-element series film such as Fe—Co—B—C—Sm film, Fe—Co—B—C—Sn film, Fe—Co—B—C—Si film, Fe—Co—Sn—Ta—N film or the like, a 3-element series film such as Co—Hf—B film, or a 2-element series film such as Ni—Fe film or the like may be used for the same purpose.

An underlying antiferromagnetic film used in the embodiments is made of $Ir_{20}Mn_{80}$. Alternatively, this film may be made of any antiferromagnetic material such as Fe—Mn, Ni—Mn, Pd—Mn, Ir—Mn, Rh—Mn, Ru—Mn, Co—Mn, an oxide containing Fe, Co or Ni.

Further, the films having inplane unidirectional magnetic anisotropy which are combined to improve the high-frequency magnetic properties may be stacked one on another or may be arranged parallel to one another and spaced at prescribed intervals.

Moreover, various changes and modifications can be made without departing from the spirit and scope of the invention.

As described above, the present invention can provide a ferromagnetic film for use in a planar inductance element such as a planar inductor, a thin-film magnetic head or the like, which excels in controllability in terms of high-saturation magnetization, soft magnetism and inplane uniaxial magnetic anisotropy and which has high-frequency permeability and magnetic properties changing or deteriorating only a little as an anisotropic stress varies during or after the manufacture of the planar inductance element, and can also provide a planar inductance element which has a ferromagnetic film of this type.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A planar inductance element having a ferromagnetic layer which has at least inplane uniaxial magnetic anisotropy, which is a single ferromagnetic film or a composite film comprising a ferromagnetic film and magnetic films, and which has been thermally, magnetically or mechanically treated and come to acquire inplane unidirectional magnetic anisotropy with magnetic moment aligned in one direction in a plane of the ferromagnetic film.

2. A planar inductance element according to claim 1, wherein said ferromagnetic layer has two-fold rotation symmetry or four-fold rotation symmetry with respect to a vertical axis, and the inplane unidirectional magnetic anisotropy of said ferromagnetic layer has a direction parallel to an axis of the uniaxial magnetic anisotropy or inclined at 30°±10° to the axis of said uniaxial magnetic anisotropy.

3. A planar inductance element according to claim 1, wherein said ferromagnetic layer is rectangular or square, and the inplane unidirectional magnetic anisotropy of said ferromagnetic layer has a direction which is parallel to one side of said ferromagnetic layer or is inclined at 30°±10° to said side thereof.

4. A planar inductance element according to claim 1, further comprising at least one other ferromagnetic layer which has at least inplane uniaxial magnetic anisotropy and which is a single ferromagnetic film or a composite film comprising a ferromagnetic film and magnetic films.

5. A planar inductance element according to claim 4, wherein the inplane unidirectional magnetic anisotropy of said at least one other ferromagnetic layer has a direction which is different from the direction of inplane unidirectional magnetic anisotropy of said ferromagnetic layer.

6. A planar inductance element according to claim 4, wherein the inplane unidirectional magnetic anisotropy of said at least one other ferromagnetic layer has a direction which is parallel or at right angles to the direction of inplane unidirectional magnetic anisotropy of said ferromagnetic layer.

7. A planar inductance element according to claim 1, wherein said ferromagnetic layer has a saturation magnetostriction constant of at least 0.1 ppm in absolute value.

8. A planar inductance element according to claim 1, wherein said ferromagnetic layer includes an amorphous film containing Fe, Co, B and a 4B-group element, or a film of composite phase consisting of a nanocrystalline phase and an amorphous crystal phase.

9. A planar inductance element having a ferromagnetic layer which has at least inplane uniaxial magnetic anisotropy, which is a single ferromagnetic film or a composite film comprising a ferromagnetic film and magnetic films, and which has inplane unidirectional magnetic anisotropy having a direction which is inclined at 30°±10° to a direction in which a tensile stress or a compressive stress is applied in a plane of the ferromagnetic layer.

10. A planar inductance element according to claim 9, wherein a resin layer is used as a upper protection film of the single ferromagnetic film or the composite film, and the inplane unidirectional magnetic anisotropy has been developed by an anisotropic tensile or compressive stress applied in the plane of the ferromagnetic film during a curing process of the resin layer.

11. A planar inductance element according to claim 9, wherein said ferromagnetic layer comprises a plurality of ferromagnetic films including said single ferromagnetic film or said composite film.

12. A planar inductance element according to claim 11, wherein inplane magnetic anisotropy direction of at least one of said plurality of ferromagnetic films differs from inplane magnetic anisotropy direction of any other of said plurality of ferromagnetic films.

13. A planar inductance element according to claim 11, wherein inplane magnetic anisotropy direction of at least one of said plurality of ferromagnetic films is parallel or at right angles to inplane magnetic anisotropy direction of any other of said plurality of ferromagnetic films.

14. A planar inductance element according to claim 9, wherein said ferromagnetic layer has a saturation magnetostriction constant of at least 0.1 ppm in absolute value.

15. A planar inductance element according to claim 9, wherein said ferromagnetic layer includes an amorphous film containing Fe, Co, B and a 4B-group element, or a film of composite phase consisting of a nanocrystalline phase and an amorphous crystal phase.

16. A planar inductance element having a ferromagnetic layer which has at least inplane uniaxial magnetic anisotropy, which is a single ferromagnetic film or a composite film comprising a ferromagnetic film and magnetic films and which has inplane unidirectional magnetic anisotropy, one of said magnetic films being an antiferromagnetic film.

17. A planar inductance element according to claim 16, wherein said ferromagnetic layer comprises a plurality of ferromagnetic films including said single ferromagnetic film or said composite film.

18. A planar inductance element according to claim 17, wherein inplane magnetic anisotropy direction of at least one of said plurality of ferromagnetic films differs from inplane magnetic anisotropy direction of any other of said plurality of ferromagnetic films.

19. A planar inductance element according to claim 17, wherein inplane magnetic anisotropy direction of at least one of said plurality of ferromagnetic films is parallel or at right angles to inplane magnetic anisotropy direction of any other of said plurality of ferromagnetic films.

20. A planar inductance element according to claim 16, wherein said ferromagnetic layer has a saturation magnetostriction constant of at least 0.1 ppm in absolute value.

21. A planar inductance element according to claim 16, wherein said ferromagnetic layer includes an amorphous film containing Fe, Co, B and a 4B-group element, or a film of composite phase consisting of a nanocrystalline phase and an amorphous crystal phase.

22. A planar inductance element according to claim 16, wherein said antiferromagnetic film is made of any antiferromagnetic material such as Fe—Mn, Ni—Mn, Pd—Mn, Ir—Mn, Rh—Mn, Ru—Mn, Co—Mn, an oxide of Fe, Co or Ni.

23. A planar inductance element according to claim 1, wherein one of said magnetic films consists of an antiferromagnetic film which is made of a antiferromagnetic material selected from the group consisting of Fe—Mn, Ni—Mn, Pd—Mn, Ir—Mn, Rh—Mn, Co—Mn, and oxides of Fe, Co or Ni.

24. A planar inductance element according to claim 9, wherein one of said magnetic films consists of an antiferromagnetic film which is made of a antiferromagnetic material selected from the group consisting of Fe—Mn, Ni—Mn, Pd—Mn, Ir—Mn, Rh—Mn, Co—Mn, and oxides of Fe, Co or Ni.

* * * * *